United States Patent
Mingazhev

(10) Patent No.: US 6,261,422 B1
(45) Date of Patent: Jul. 17, 2001

(54) PRODUCTION OF HOLLOWED/CHANNELED PROTECTIVE THERMAL-BARRIER COATINGS FUNCTIONING AS HEAT-EXCHANGERS

(75) Inventor: Askar Dzhamilevich Mingazhev, Ufa (RU)

(73) Assignee: IONICA, LLC, Los Angeles, CA (US)

( * ) Notice: Subject to any disclaimer, the term of this patent is extended or adjusted under 35 U.S.C. 154(b) by 0 days.

(21) Appl. No.: 09/477,602

(22) Filed: Jan. 4, 2000

(51) Int. Cl.$^7$ .................................................. C23C 14/34
(52) U.S. Cl. .............................. 204/192.12; 204/192.16; 205/80; 427/331; 427/422; 427/585
(58) Field of Search ..................... 204/192.12, 192.16; 205/80; 427/331, 422, 585

(56) References Cited

U.S. PATENT DOCUMENTS

| | | | |
|---|---|---|---|
| 3,890,456 | * | 6/1975 | Dils ........................................ 428/216 |
| 4,743,462 | * | 5/1988 | Radzavich et al. ..................... 427/34 |
| 5,382,453 | * | 1/1995 | Mason .................................... 427/249 |
| 5,624,721 | * | 4/1997 | Strangman ............................ 427/585 |

FOREIGN PATENT DOCUMENTS

| | | | |
|---|---|---|---|
| 3706260 | 9/1988 | (DE) | ................................ F01D/5/18 |
| 2172060 | 9/1986 | (GB) | ................................ F01D/5/00 |

OTHER PUBLICATIONS

McClanahan, E.D., "Initial Work on the Application of Protective Coatings to Marine Gas Turbine Components by High–Rate Sputtering", The American Society of Mechanical Engineers, pp. 1–12, Dec. 1974.*

* cited by examiner

Primary Examiner—Nam Nguyen
Assistant Examiner—Steven H. VerSteeg

(57) ABSTRACT

A process for production of hollow thermal-barrier coatings functioning as high-temperature heat-exchangers made of metal and/or non-metallic materials, applied onto the surface of metal and/or non-metallic substrata. The hollow/channeled coatings having a predetermined design, comprising an outer shell and an inner framework, which framework joins the outer shell with the surface of the substrate, together making a system of hollows and/or channels in the space between the outer shell and the substrate. The process includes: 1) preparing the substrate surface for application of materials; 2) forming auxiliary extractable elements to model required hollows and channels in the coating; 3) applying a layer of material, constructing the inner framework and/or an outer shell, by one of the following methods: physical or chemical vapor deposition, sputtering in a vacuum and thermal spray processes, or by chemical or electrochemical deposition, or by any combination thereof, 4) repeating the cycle of the preceding steps to produce all the tiers of the coating; 5) final extraction out of the coating of the auxiliary extractable elements by any existing methods, such as by sublimation in a vacuum. The present process allows the production of hollow coatings with at least two independent systems of hollows and channels. One system is designed for heat-carrier passage, and another for protective inert gas, to reduce oxidation in high-temperature components. In a particular embodiment, a two-tiered hollow/channeled coating containing channels for a heat-carrier is formed by application of a material through the process of physical vapor deposition.

25 Claims, 4 Drawing Sheets

PRODUCTION OF HOLLOWED/CHANNELED PROTECTIVE THERMAL-BARRIER COATINGS FUNCTIONING AS HEAT-EXCHANGERS

BACKGROUND OF THE INVENTION

1. Field of the Invention

This invention pertains to the field of coatings for high-temperature structural materials. This invention comprises the technology, where mainly physical vapor deposition, sputtering in a vacuum and thermal spray processes, are used for production of hollow protective thermal-barrier coatings functioning as high-temperature heat-exchangers, which coatings can be used, e.g., for thermal barrier protection of gas turbine engine blades and other components against degradation by high-temperature oxidation and hot corrosion.

2. Background

Generally, the following described process is used to fabricate a surface heat-exchanger on the substrate of a component: open channels for heat-carrier are made on the surface of the component's material (substrate), then these channels are filled by an extractable filler to the surface level, and the whole of the obtained surface is covered by an unbroken/continuous layer of a material, making an outer shell (the cover), covering the channels, after which the filler is extracted from the channels, and a surface heat-exchanger, as described below, is obtained, consisting of an outer shell, covering open channels cut into the substrate body. The shaping of the open channels in the substrate body is produced by various techniques, e.g., during the casting of the component, or formed by mechanical or electromechanical machining. The channels are filled by an extractable filler, usually, in a paste form. The filler prevents the deposited material of the outer shell from getting into the channels. The formation of the outer shell may be accomplished using various techniques of coating application, e.g., thermal spray, or physical vapor deposition. The material, of which the outer shell is formed, is chosen based on the specific functions to be carried out by the protected component, (e.g., UK Patent Application GB 2172060 A, INT CL F01D 5/00, by Rolls Royce Ltd.; Germany, Patent Application DE 37 06 260, INT CL F 01 D 5/18, by Siemens AG; Japan, Patent Application 61-25 881, INT CL F 01 D 5/18).

In the prior art, surface heat-exchangers are used in various fields when a decrease or an increase of surface temperature of a component is required; chiefly of specific components operating in severe temperature and/or mechanical stress conditions. Also known and used is the method of mounting ready-made heat-exchangers onto the surface of a component.

Usually the elements of such heat-exchangers are produced by the stamping technique and are fixed onto a component surface by soldering or welding. But such heat-exchange surfaces are complex to manufacture and unreliable in operation, which is why they are limited for practical use and cannot be used for gas-turbine engine (GTE) blades, and similar components operating in severe temperature and mechanical stress conditions. Development of effective, reliable surface heat-exchangers possessing a range of protective coating properties is a continual challenge in airspace, power-generation, and rocket technologies.

To adequately describe and illustrate the problem being considered, observation of the use of such surface heat-exchangers for protection of GTE blades from overheating will suffice.

In modern GTE and GTU (gas-turbine units), operational temperatures are more than 1000° C. Improving economic operation and efficiency of a gas-turbine requires an increase in operating temperatures, which could be provided either by cooling GT components during operation, or by using materials with higher temperature and stress resistant properties.

PRIOR PROTOTYPE EXAMPLE

One prior prototype of a surface heat-exchanger is described as a shell (sheath) covering open channels, which are cut into the body of the substrate (the body of the protected component). This type of device and the required technology have a number of significant drawbacks, which lower the quality and operational properties of a surface heat-exchange.

Discussion of drawbacks.

1. In this prototype the partitions between the channels, which are, actually, the partitions of a heat-exchanger, must be wide enough to provide efficient cohesion of the shell with the protected component (the area of the partitions' end-face).

If the areas of cohesion are increased to provide better adhesion of the shell, then areas for cooling channels are decreased, leading to the following disadvantageous consequences:

the channel flow area decreases;

severe and debilitating temperature fluctuations occur within the shell at the conjunction points of cooling channels and adhesion surfaces;

a high level of heat transfer from the shell to the substrate via the partitions, which decreases the protective properties of the shell.

2. The presence of channels in the body of the substrate (in the body of the blade itself) probably greatly reduces its mechanical strength, acting as a concentrator of mechanical tensions.

3. The only type of surface heat-exchanger possible to produce by this technology is the one described above as a prototype.

4. A multi-tier heat-exchanger is impossible to produce using such technology.

5. It is extremely difficult to vary width and configuration of the channels and partitions cross-sections.

6. It is impossible to apply a ceramic coating onto the shell, due to the severe temperature fluctuations within the shell.

SUMMARY OF THE INVENTION

This invention deals with basic principles of the production of hollow thermal-barrier coatings functioning as heat-exchangers, which may be applied for various design embodiments. The coatings consist of an outer shell and an inner framework, joining the outer shell with the surface of the substrate and building up a system of hollows and/or channels in the space between the outer shell and the substrate. In other words, the coatings which can act as heat-exchangers are produced by certain methods of the application of materials, as described below:

1) preparation of the surface of the substrate for application of materials;
2) modeling the hollows and/or channels by application of the auxiliary extractable elements onto the surface of the substrate, which auxiliary elements are made of extractable filler(s);

3) application of the layer of the material of the coating, to form the inner framework on the obtained surface (the obtained surface being comprised of open areas of the substrate (and/or bondcoat) and that of auxiliary elements. Said obtained surface achieved as the result of repeated previous cycles (p.1, 2) will consist of the applied material of the coating and auxiliary elements, and/or a combination thereof).

4) repetition of steps 2 and 3 to complete formation of the framework (preceded by appropriate preparation of the obtained surface);

5) application of the layer of the main material of the coating, forming the outer shell, onto the appropriately prepared surface, which surface is a common surface comprised of the surfaces of the open areas of the framework and the surfaces of the auxiliary elements;

6) final extraction of the auxiliary elements from the assembled body/central portion of the coating.

The object of the present invention is to improve the quality and functional properties of surface heat-exchangers with protective outer shells, due to the elimination of the aforementioned drawbacks by means of:

1. Transpositioning the channels/hollows for a heat-carrier directly into the body of the protective coating.
2. Significant decrease of the partition thickness between the channels/hollows, which will allow
   a nearly doubled capacity of the flow area of the channels retaining desired height;
   equalization of the temperature within the shell and on the surface of the component;
   decrease of heat transfer from the shell to the component, and an increase of heat transfer from the shell to the heat-carrier.
3. Increase in area and strength of surface cohesion.
4. The strength of the protected component is improved because the technology of this invention does not require channels being cut into the body of the component.
5. Ability to form both single and multi-tier coatings functioning as heat-exchangers.

These and other objects and advantages of this invention are described in detail in the description of the invention contained herein.

BRIEF DESCRIPTION OF THE DRAWING

The invention may better be understood by reference to the following detailed description of a preferred embodiment, which is given hereafter in conjunction with several figures of the drawing in which.

DETAILED DESCRIPTION OF A PREFERRED EMBODIMENT

As the basis of the preferred design of the proposed hollow/channeled coating functioning as a heat-exchanger, the traditional lamellar type heat exchanger is taken.

Figure 1:
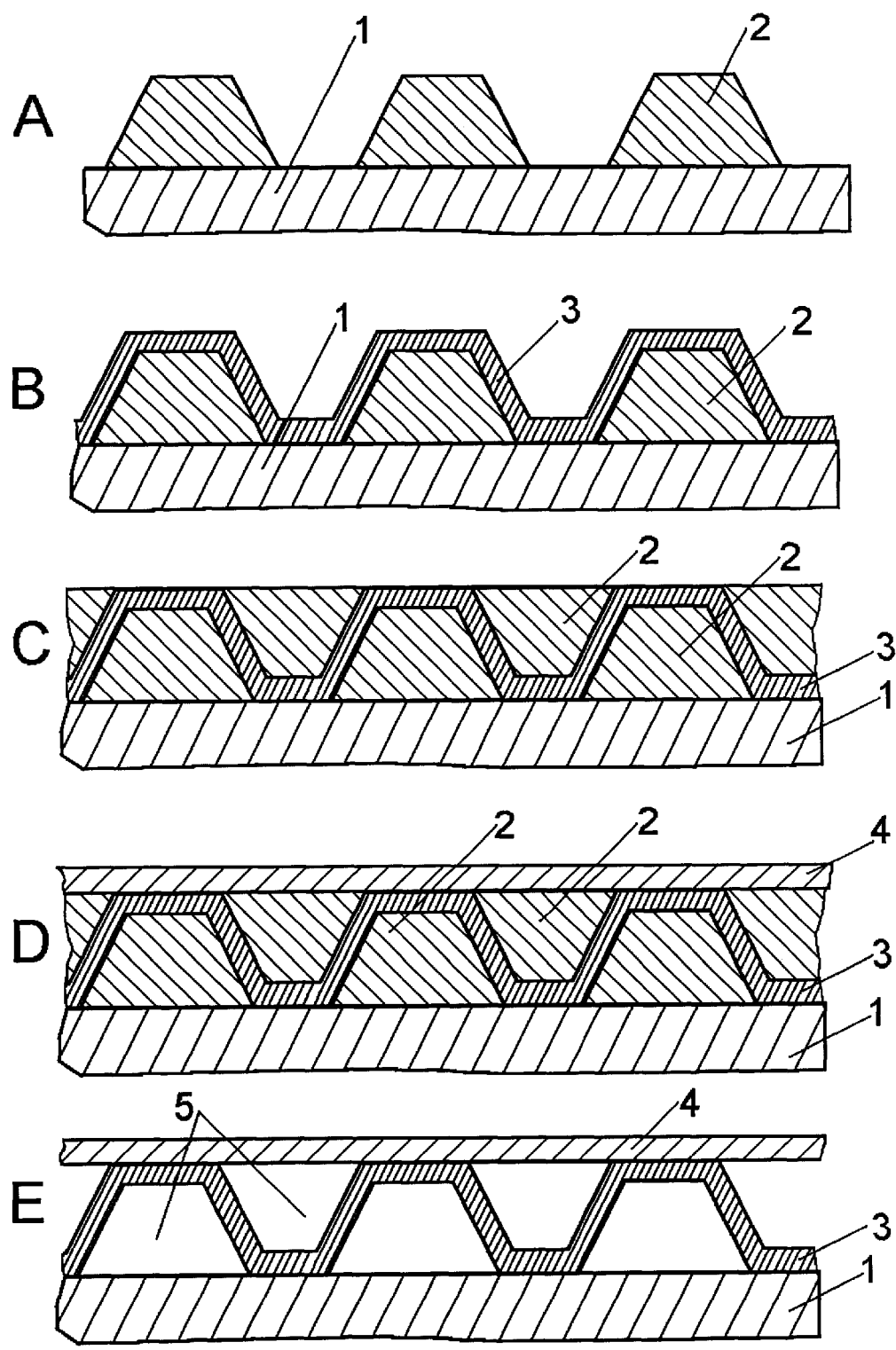
FIG. 1 is a cross sectional view of the layers during production of a hollow/channeled coating in accordance with the present invention.

Referring to FIG. 1, the principal steps in the production of a hollow/channeled coating that functions as a heat exchanger are shown. The consequence of the coating formation steps is as follows:

1. The substrate 1 (the surface of the component to be protected) is prepared for materials application in accordance with the chosen method of coating application;
2. The auxiliary elements 2 of the first tier formation are formed of an extractable filler on the surface of the substrate 1, as shown in FIG. 1A;
3. The coating main material is applied onto the obtained surface as a continuous layer to obtain the inner framework 3 (or partitions), as shown in FIG. 1B;
4. The cycle of steps 2 and 3 is repeated to form a second tier of the coating, in which the second tier auxiliary elements 2 are formed on the inner framework surface 3 (FIG. 1C) and the coating main material layer is applied, to form an outer shell 4 of the coating in this particular case (FIG. 1D); and
5. The auxiliary elements 2 are extracted, and a complete coating is obtained with inner hollows or channels 5 (FIG. 1E).

Figure 3:
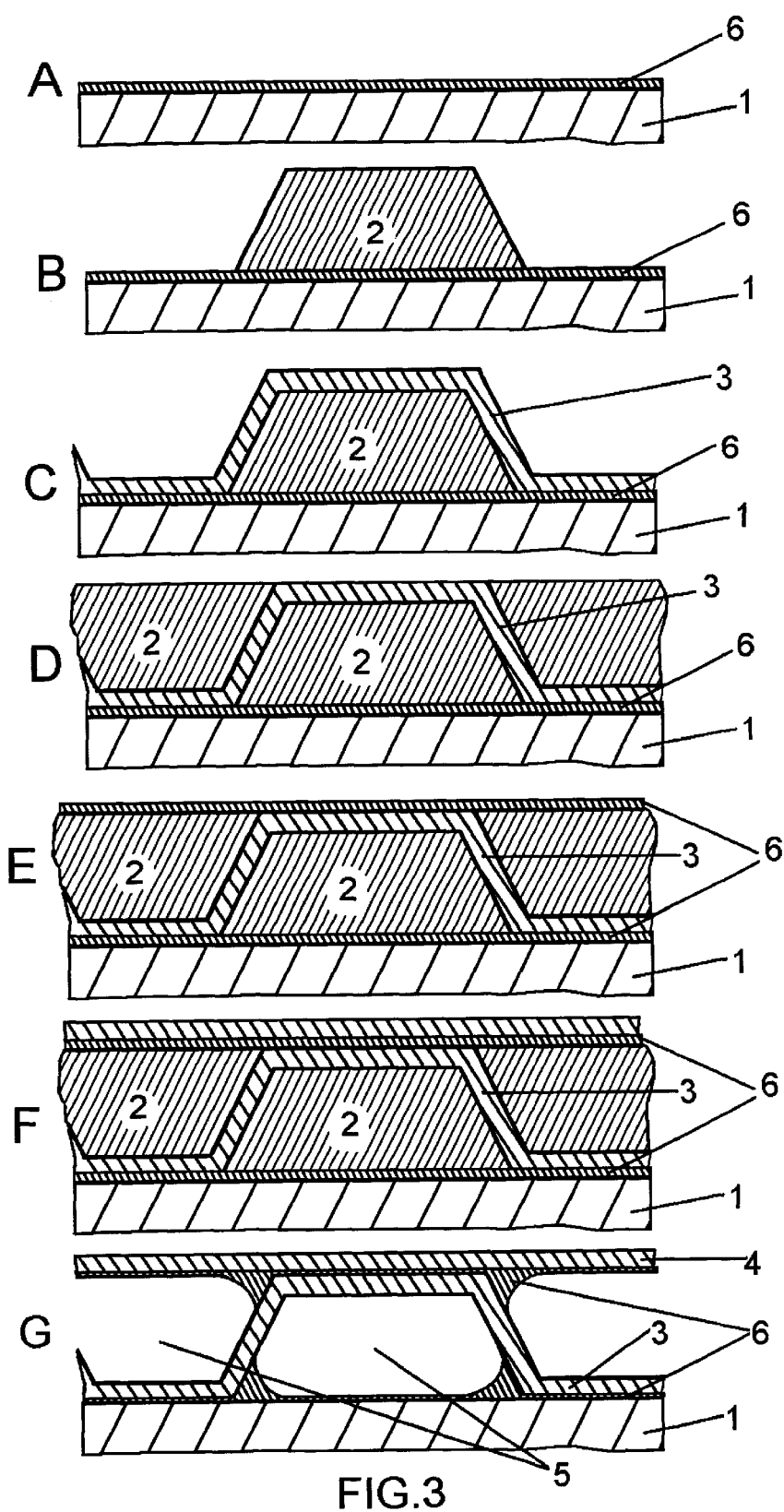
FIG. 3 is a cross sectional/view of the layers during production of a hollow/channeled coating with bond coat.

FIG. 3 shows the same steps as in FIG. 1 with bond coat 6.

The preparation of the surface of the substrate 1 for the material application may be accomplished by various methods, the selection of which is based on the choice of the material application method and the properties of the material being applied. Preparation may include application of a bondcoat 6, which in some cases may act as solder for better adhesion of the materials both of the substrate and the coating.

Application of the extractable auxiliary elements on the surface of the substrate 1 may be accomplished by one of the following methods:

moldering (molding, sintering, stamping) the auxiliary elements onto the substrate surface by means of a die, which have moldering cells, providing the required shape, dimensions, distribution and location of the auxiliary elements 2;

application of the layer of the material of the extractable filler onto the surface through a mask attached to the surface, which mask has openings (holes/cuts) located and shaped so as to model location, distribution and shape of the auxiliary elements, which application of the layer of the material of the extractable filler can be accomplished, e.g. by thermal spraying of a powder-like material applied with the thickness equal to the required height of the auxiliary element 2.

application of the filler in a layer to the required thickness (equal to the predetermined height of the auxiliary element 2), followed by the removal of unneeded portions of the filler by one or more of the following techniques: either by local heating and removal due to sublimation of the unneeded portions of the filler, e.g. by a high-energy beam (a laser beam) or by application of a heated molder, providing the local removal of the material in the heated zones; or by one of the known methods of physical, chemical, electrochemical or plasma etching, or mechanical machining.

The layer of the material of the extractable filler is applied to a thickness in the range between 0.0001–10,000 microns. This provides hollows in the finished structure with dimensions in the range between 0.0001–10,000 microns.

Application of the main material(s) layer, forming the inner framework 3 and the outer shell 4, to the obtained surface, may be done by one of the following methods or by their combination: physical or chemical vapor deposition, sputtering in a vacuum and thermal spray processes, chemical or electrochemical deposition. The choice of method of deposition of the coating main material is based on certain and/or particular properties of the coating, on suitability of a specified method for a particular protected component, and, also, on economic considerations. These conditions are also applicable for the deposited material choice. The coating material forming the inner framework and/or the outer shell may be chosen from a variety of high-temperature coatings, thermal-barrier coatings, corrosion-resistant coatings, erosion-resistant coatings, or wear-resistant coatings. For example, the coating material may be a high-temprature coating such as MCrAlY. Alternatively, the coating material may be a thermal-barrier material such as ceramic. Choices of protective coating technologies are well known; thus, it is not necessary to consider them in further detail. The outer shell 4 is formed to a thickness in the range of 0.01–1000 microns. The thickness of the coating layer forming the inner framework 3 is in the range of 0.001–1000 microns.

So as to provide a higher quality of the coating, especially when the physical vapor deposition is used, prior to application of the auxiliary elements onto the substrate surface, and also prior to the application of the main material of the coating, a metal (alloy) bondcoat of 1–60 microns thickness is applied, which in some cases may act as solder for better adhesion of the materials both of the substrate and the coating.

With the described coating formation process, extractable filler(s) is to be used. After completing the formation of all the layers of the coating, the filler is extracted from the coating by one of the following techniques, depending on the properties of the chosen filler: by its sublimation in vacuum when heated (combined with thermal treatment of the coating); by one of the known dissolving methods: physical, chemical, or electrochemical, etc. The auxiliary elements are made of a material capable to sublimate in a vacuum at a temperature lower than the temperature that would cause degradation of operational features of the coating that forms the inner framework 3 and/or outer shell 4.

Metal fluoride compounds may be used for the materials choice of the extractable filler: $ZrF_4$, $BeF_2$, NaF, $CrF_3$, $CoF_2$, $MgF_2$, $BaF_2$, $CaF_3$, $FeF_2$, or metal chlorides: KCl, or metal oxides: BaO.

According to the preferred embodiment of the invention (in fact, there could be many embodiments), a two-tiered hollow/channeled coating is formed on a protected component (i.e., having two tiers of channels). The auxiliary elements are formed by stamping. The main material of the coating is applied by physical vapor deposition; the bondcoat, by gas thermal method.

Figure 2:
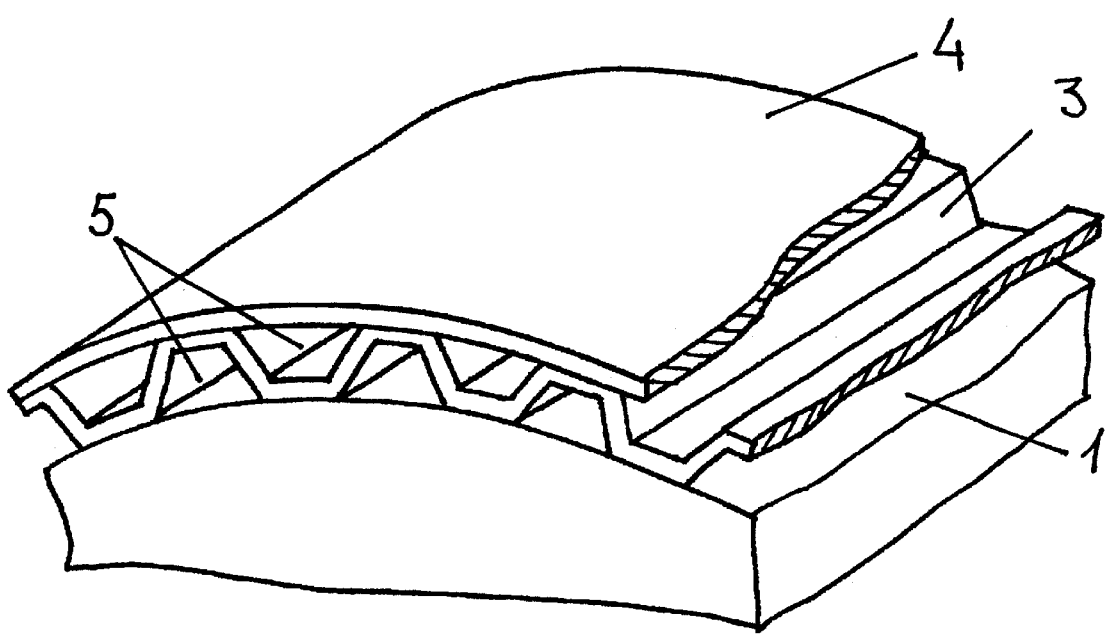
FIG. 2 is a perspective view (partially cut away) of a coating formed in accordance with the present invention.
Figure 4:
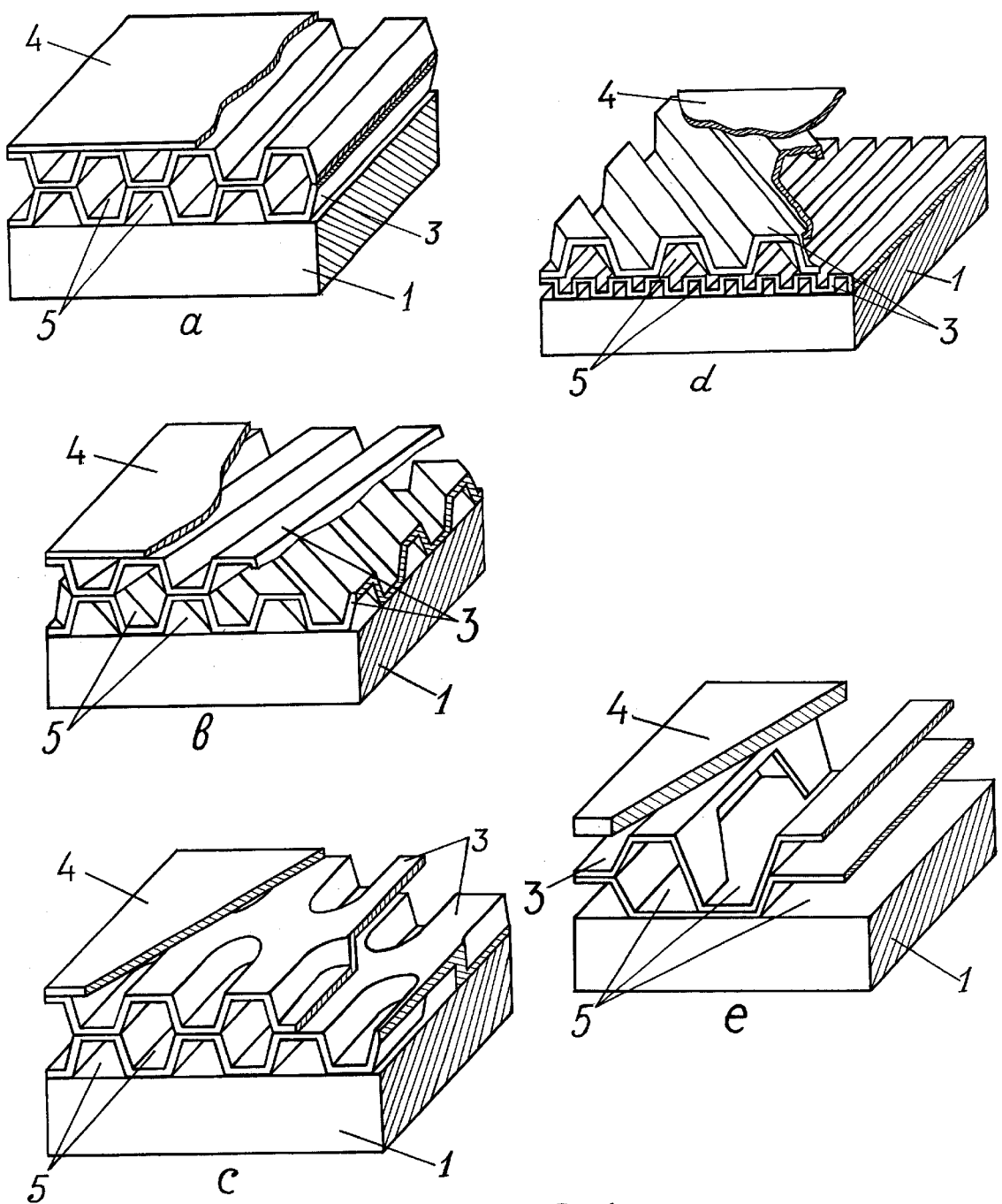
FIGS. 4(a, b, c, d, e) is a perspective view (partially cut away) of coatings obtained after repeated cycles of production.

As the basis of the preferred design of the proposed protective thermal-barrier coating functioning as heat-exchangers, the traditional lamellar heat-exchanger is used as a prototype. The present process allows the production of hollow coatings with at least two independent systems of hollows and channels (FIG. 2, FIG. 4). One system is designed for heat-carrier passage, and another for protective inert gas, to reduce oxidation in high-temperature components. As illustrated, the process produces an inner framework 3 that has a shape of a zigzag partition of trapezoid cross-section.

An additional coating, such as a layer of ceramic thermal-barrier coating, may be applied on top of the structure shown. The additional coating may have a thickness in the range between 0.0111–20,000 microns.

The described consequence of these steps was realized to obtain a coating functioning as a heat-exchanger on a gas turbine blade made of a high-temperature Ni based super alloy.

There were already existing outlets for operational cooling air supply in the substrate. The surface preparation for coating was done by air sand blower machining with micro dispersed corundum. As an auxiliary elements material sodium fluoride (NaF) was used, having the sublimation temperature T=693° C. under the vacuum 0.0001 mm Hg. The filler was applied onto the surface in correspondence with the required forms of the channels to be obtained. As the coating main material a high-temperature resistant alloy of NiCrAlY system was used, applied according to the traditional technology of application of protective coatings onto GTE blades. Prior to the application of the auxiliary elements onto the substrate surface, and, also, prior to the main coating material application, a bondcoat of high-temperature resistant solder was applied. The bondcoat was applied by plasma spraying. The bondcoat thickness was 20 microns. The inner framework thickness was 180 microns, the outer shell—200 microns. The height of the auxiliary elements was 500 microns. The filler extraction was done by its vacuum sublimation combined with thermal diffusion annealing of the coating in a vacuum furnace under the temperature of 1080° C. for four hours.

FIG. 2 presents a view of the coating, obtained in accordance with the considered particular example. The design of the obtained version is as follows: the outer shell 4, lying on the corrugated framework 3, dividing hollow/channeled space between the substrate 1 and the shell 4 into the system of channels (hollows) 5.

While this invention has been described in terms of a specific embodiment thereof, it is to be understood that it is not limited thereto, but rather only to the extent set forth hereafter in the claims which follow.

I claim:

1. A process for production of a hollow coating applied onto a substrate surface, said coating having a pre-determined design of hollows, which process includes preparation of said substrate surface for application of said coating and at least one cycle consisting of the following steps (a) and (b):

(a) modeling said hollows by formation of auxiliary elements on said substrate surface, or, if said cycle is repeated, modeling said hollows by formation of auxiliary elements onto the surface of a previous layer of said coating; said auxiliary elements modeling dimensions, shapes, and location of said hollows relative to said substrate;

(b) application of a layer of pre-determined thickness of desired material of said coating onto an obtained surface; said obtained surface comprising said auxiliary elements in combination with open areas of said substrate not covered by said auxiliary elements, or, if said cycle is repeated, said obtained surface comprising said auxiliary elements in combination with open areas of said previous layer of said coating not covered by said auxiliary elements;

and extraction of said auxiliary elements after a pre-determined number of repetitions of said cycle.

2. A process for production of said coating as claimed in claim 1, wherein said formation of said auxiliary elements is done by a process for production of extractable models.

3. A process for production of said coating as claimed in claim 2, where said process for production of extractable models comprises applying materials of said auxiliary elements onto said substrate surface or onto said previous layer of said coating.

4. A process for production of said coating as claimed in claim 3, where said step of applying material is physical vapor deposition and/or chemical vapor deposition and/or sputtering and/or thermal spray processes.

5. A process for production of said coating as claimed in claim 4, where said auxiliary elements are produced by the following steps:
   a) by application of a solid layer of material of said auxiliary elements onto said substrate or said previous layer with a thickness of said solid layer equal to a pre-determined height of said auxiliary elements, and
   b) by application of a pre-determined shape to said auxiliary elements by means for the removal of unneeded material of said auxiliary elements.

6. A process for production of said coating as claimed in claim 3, where said step of applying material is done through a mask, said mask modeling dimensions and location of said auxiliary elements.

7. A process for production of said coating as claimed in claim 6, where said auxiliary elements are made of material capable to sublimate at a temperature lower than the temperature that would cause degradation of operational features of said coating.

8. A process for production of said coating as claimed in claim 7, where said auxiliary elements are made of material, capable to sublimate in a vacuum at a temperature lower than the temperature causing degradation of operational features of said coating.

9. A process for production of said coating as claimed in claim 8, where said material, of which said auxiliary elements are made, is made of at least one of the following compounds: $ZrF_4$, $BeF_2$, $NaF$, $CrF_3$, $CoF_2$, $MgF_2$, $BaF_2$, $CaF_3$, $FeF_6$, $KCl$, $BaO$.

10. A process for production of said coating as claimed in claim 1, where said application of said material of said coating is done by means for application of coatings.

11. A process for production of said coating as claimed in claim 10, where said means of said application of said material of said coating is one of the following methods and/or any combination thereof: physical or chemical vapor deposition, sputtering in a vacuum, thermal spray processes, or chemical or electrochemical deposition.

12. A process for production of said coating as claimed in claim 10, where said means of said application of said material of said coating is a method for application of high-temperature coatings, thermal-barrier coatings, corrosion-resistant coatings, erosion-resistant coatings, or wear-resistant coatings.

13. A process for production of said coating as claimed in claim 1, where said coating consists of an outer shell and an inner framework, which said inner framework joins said substrate surface with said outer shell and divides a space between said outer shell and said substrate surface in a system of said hollows.

14. A process for production of said coating as claimed in claim 13, where said pre-determined design of said hollows is a design of a heat-exchanger.

15. A process for production of said coating as claimed in claim 14, where said preparation of said substrate surface includes application of auxiliary bond coat.

16. A process for production of said coating as claimed in claim 15, where, after completion of said coating application, a thermal-barrier coating is applied onto said outer shell.

17. A process for production of said coating as claimed in claim 15, where said hollows constitute at least two independent systems, one of said systems being designed for a heat-carrier, the other being designed for inert, protective gas.

18. A process for production of said coating as claimed in claim 13, where said inner framework has a shape of a zigzag partition of trapezoid cross-section.

19. A process for production of said coating as claimed in claim 13 where said preparation of said substrate surface includes application of auxiliary bond coat.

20. A process for production of said coating as claimed in claim 19, where, after completion of said coating application, a thermal-barrier coating is applied onto said outer shell.

21. A process for production of said coating as claimed in claim 13, where, after completion of said coating application, a thermal-barrier coating is applied onto said outer shell.

22. A process for production of said coating as claimed in claim 13, where said outer shell thickness range between 0.01–1000 microns, said framework thickness range between 0.001–1000 microns, cross-section dimensions of said hollows range between 0.0001–10000 microns, and said coating thickness range between 0.0111–20000 microns.

23. A process for production of said coating as claimed in claim 13, where said hollows constitute at least two independent systems, one of said systems being designed for a heat-carrier, the other being designed for inert, protective gas.

24. A process for production of said coating as claimed in claim 1, where said preparation of said substrate surface includes application of auxiliary bond coat.

25. A process for production of said coating as claimed in claim 24, where said coating is applied to an airfoil of a gas-turbine.

* * * * *